US008324951B1

(12) United States Patent  (10) Patent No.: US 8,324,951 B1
Zarkesh-Ha et al.  (45) Date of Patent: Dec. 4, 2012

(54) DUAL DATA RATE FLIP-FLOP CIRCUIT

(75) Inventors: Payman Zarkesh-Ha, Albuquerque, NM (US); Vallabh Srikanth Devarapalli, Albuquerque, NM (US); Steven C. Suddarth, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 7 days.

(21) Appl. No.: 13/082,826

(22) Filed: Apr. 8, 2011

Related U.S. Application Data

(60) Provisional application No. 61/342,031, filed on Apr. 8, 2010.

(51) Int. Cl.
*H03K 3/00* (2006.01)
(52) U.S. Cl. ........................................... 327/206
(58) Field of Classification Search ........................ None
See application file for complete search history.

(56) References Cited

U.S. PATENT DOCUMENTS

2010/0052756 A1* 3/2010 Tang .............................. 327/203

* cited by examiner

*Primary Examiner* — Lincoln Donovan
*Assistant Examiner* — Sibin Chen
(74) *Attorney, Agent, or Firm* — Valauskas Corder LLC

(57) ABSTRACT

A dual data rate flip-flop circuit for reducing single event upset errors in the flip-flop circuit including two or more latch circuits connected in parallel. The latch circuits each have a clock input, data input, and latch circuit output. The dual data rate flip-flop circuit also includes a C-element, which has a plurality of inputs and a C-element output. The outputs of the latch circuits are provided to inputs of the C-element, and a keeper circuit is connected to the C-element output. An output buffer inverter connects to the C-element output and has an output corresponding to the dual data rate flip-flop circuit output.

11 Claims, 10 Drawing Sheets

| In1 | In2 | Out |
|---|---|---|
| 0 | 0 | 1 |
| 1 | 1 | 0 |
| 0 | 1 | Previous Value |
| 1 | 0 | Previous Value |

| C1 | | C2 | | Out |
|---|---|---|---|---|
| In1 | In2 | In3 | In4 | |
| 0 | 0 | 0 | 0 | 1 |
| 1 | 1 | 1 | 1 | 0 |
| All Other Inputs | | | | Previous Value |

# DUAL DATA RATE FLIP-FLOP CIRCUIT

This application claims the benefit of U.S. Provisional Patent Application Ser. No. 61/342,031 filed Apr. 8, 2010, the disclosure of which is incorporated herein by reference in its entirety.

GOVERNMENT FUNDING

The invention described herein was made with government support under grant number FA 9453-08-2-0259, awarded by the Air Force Research Laboratory. The United States Government may have certain rights in the invention.

FIELD OF THE INVENTION

The present invention generally relates to electrical circuits including in integrated circuits, and in particular to dual data rate flip-flop circuits.

BACKGROUND OF THE INVENTION

Electrical or digital logic circuits that include flip-flop architectures are increasingly being reduced in size to accommodate the increasing number of electrical circuits formed on semiconductor chips. This is known as circuit scaling, which has reduced gate capacitance thereby increasing sensitivity to radiation induced soft errors. Circuit scaling has also reached a point of maximum clock frequency to maintain acceptable energy consumption.

Electronic circuit scaling is occurring in tandem with a desire to explore space more extensively. As the amount of electrical charge needed to flip a computer bit to a different digital logic state is reduced with scaling, radiation effects are causing problems in integrated circuits. Triple Modular Redundancy (TMR), watch dog timers, and majority voting techniques have been commonly used to reduce the impact of radiation effects on the outputs of integrated circuits. However, the area and power overhead involved in designing such protection circuits is extremely high and increases the inefficiency and complexity of integrated circuits.

Of particular importance in electronic circuit scaling are flip-flop architectures that are commonly used to store flip-type logical states, such as "High" or "Low" logic states stored in binary logic circuits. One known problem with the scaling down of flip-flop circuits is that the circuits are vulnerable to inadvertent fluctuations in their logic states due to interference from high-energy subatomic particles or electromagnetic radiation. This problem is of particular concern for certain applications of flip-flop circuits, such as flight, outer space, and nuclear applications.

New flip-flop circuits are desired that can reduce power consumption. It is additionally desirable to have flip-flop circuits that are radiation hardened against soft errors. One specific type of flip-flop circuits are dual data rate (DDR) flip-flop circuits. Conventional DDR flip-flop circuits can be classified into: (1) dual edge triggered flip-flop circuits, (2) explicit pulsed dual edge flip-flop circuits, and (3) implicit pulsed dual edge flip-flop circuits. A dual edge triggered flip-flop scheme is shown in FIG. 1(a). Although this technique helps reduce the clock frequency by half, it doubles the area required to form the flip-flop circuit on a semiconductor chip and also increases the load on the data and the clock inputs.

The explicit pulsed dual edge flip-flop scheme is as shown in FIG. 1(b). In this scheme, even though the clock frequency becomes half, an effective activity factor of the clock distribution network increases as each clock edge is replaced by two edges of the clock pulse. Moreover, the number of transistors used in the clock system increases in order to accommodate for the pulse generation. Implicit pulsed dual edge flip-flops use two series devices embedded in the logic branch receiving a clock and a delayed clock respectively. A general scheme is shown in FIG. 1(c).

FIG. 1(d) shows a conventional dual edge static hybrid flip-flop circuit (ep-DSFF). This circuit has a low power delay product compared to other conventional flip-flop circuits. The design has an explicit dual edge-triggered pulse generator and a high level triggered latch circuit. The pulse generator used in this circuit can be local to each flip-flop or shared among multiple flip-flops. Since the entire latch is not duplicated, the area overhead is relatively small. FIG. 1(e) shows the waveforms for the input, clock, and output of the ep-DSFF.

A typical electronic circuit that utilizes a flip-flop architecture is shown in FIG. 2(a). This electronic circuit is a sequential two latch structure implemented in a conventional D flip-flop circuit. A clock and data input "Data_in" provide inputs to a high level triggered latch circuit and a low level triggered latch circuit. An output L1 from the high level triggered latch circuit is inverted and then provided as a high level triggered latch circuit output to the low level triggered latch circuit. Similarly, an output from the low level triggered latch circuit L2 is inverted and provided as a "Data_out" output for the dual edge triggered flip-flop circuit. In certain instances, flip-flip circuits such as the conventional D flip-flop circuit of FIG. 2 are subjected to a radiation effect that is referred to a single event effect (SEE). This may occur when a high energy particle passes through an electronic circuit formed on a semiconductor chip. A particular node (shown as dots in FIG. 2) of an electronic circuit may receive a charge transferred from the high energy particle interacting with the semiconductor material forming the integrated circuit. The change in charge level at a particular node of the electronic circuit may result in a logic state of the node being altered. This change in logic state at a node may be particularly problematic for a flip-flop circuit since the change in the logic state at one node may affect the overall output of the flip-flop circuit. Generally, when an electronic circuit has a change in output due to an altered node voltage, then this event is referred to as a single event upset (SEU).

SEUs pose a major challenge for an error free electric circuit operation. Unlike the other components in a digital electronics system that can be protected from SEUs by logical masking, electrical masking and temporal masking, electrical circuits forming latching elements such as flip-flop circuits and latch circuits do not have immunity to SEUs. A radiation strike on a latching element is almost certain to propagate to the next stage of an integrated circuit. In addition, power consumption of such electronic circuits has become a bottleneck for technology advancement.

Other conventional flip-flop circuits include simplified B-SER-FF designs. A typical computer simulated output for this circuit is shown in FIG. 3. The waveform marked as "D_in" represents the data input to the respective flip-flop design. The waveform marked as "D_out" represents the output signal from the respective flip-flop design, and the waveform "CLK" represents the clock given to a respective flip-flop design. The waveform marked as "Simulated SEU" represents the artificial particle strikes in the form of current spikes given to the respective flip-flop design for SEU immunity testing. A computer simulated output for a B-SER-FF circuit using a conventional dual edge triggered technique is shown in FIG. 4. For either of the outputs, the B-SER-FF circuit designs have problems with SEU immunity, and may provide incorrect outputs when an SEU event occurs.

In order to avoid SEUs from occurring in integrated circuits, it is desirable to design electronic circuits that are radiation hardened. Radiation hardening reduces changes in outputs of electronic circuits due to SEUs. The conventional radiation hardening process includes adding additional electronic circuits to the integrated circuit and/or utilizing special materials in integrated circuit manufacture to reduce the effects of high energy particles interacting with the integrated circuits.

Conventional DDR flip-flop circuits are used in many desktop computers and FPGA boards. However, the existing design methodologies are too complicated and/or consume too much power due to the use of pulse generators that create pulses at each edge of the clock. These conventional DDR flip-flop circuits have a dual edge triggered ability by using a pulse generator. However, in the pulse generator circuitry, the pulsed clock has twice as much switching activity as the normal clock signal (each edge of the clock becomes a pulse with two edges). Therefore, the dynamic power consumption of the clock distribution network in conventional DDR flip-flop circuits is large. To maintain the performance of digital circuit systems, while reducing the energy consumption, implementation of new DDR flip-flop circuits is desired.

Technology advancements are demanding higher throughput and data rates at lower energy consumption rates while maintaining stable electronic circuits that are radiation hardened. In order to overcome these challenges, it is desirable that new electronic circuit designs having, for example, scaled down flip-flop and latch architectures address the problems associated with SEU occurrences in these circuits. Moreover, it is especially desirable that these problems be addressed for flip-flop architectures that improve clock frequencies, such as flip-flop circuits that increase clock frequencies by use of both edges of a pulsed clock input. The present invention satisfies these various demands.

SUMMARY OF THE INVENTION

A high-energy or electromagnetic radiation event may produce a voltage at a node of a digital logic circuit such as a dual data rate flip-flop circuit and change a node voltage in this circuit. This change in voltage may change the logic state at the node, which is then propagated throughout the digital logic circuit to affect the output of the circuit. The DDR flip-flop circuit according to the present invention mitigates this effect by arranging C-elements in the circuit to maintain logic states in the event of a change in node voltage at one of the nodes of the digital logic circuit.

A logic architecture is provided for hardening digital electronic circuits and providing immunity against SEUs. SEUs can alter a node voltage in a circuit, which can result in changes in logic states of the circuit. For example, latch, flip-flop, and other digital circuits can have their outputs changed due to SEUs. Many of these circuits are used for memory storage, and any changes in the logic states of such circuits are undesirable since they alter values stored in the memory. A logic architecture that uses less power than conventional flip-flop circuits is also provided.

The logic architecture according to one embodiment is a DDR flip-flop circuit having at least two latch circuits connected in parallel. In one exemplary design, two latch circuits may be formed in parallel. Each of the latch circuits has a clock input, data input, and latch circuit output. The DDR flip-flop circuit includes a C-element. The C-element has a plurality of inputs and a C-element output that can receive either a high input or a low input. For the purposes of this application, a high input is a digital logic input of "1" and can be a positive voltage (e.g., 1V), and a low input is a digital logic input of "0" and can be a lower voltage (e.g., 0V).

At least one of the C-element inputs is connected to one of the latch circuit outputs. In one embodiment, each C-element input is connected to a latch circuit output. A keeper circuit is connected to the C-element output and may include a pair of inverters formed in series. The DDR flip flop also includes an output buffer inverter which is connected to the C-element output. The output buffer inverter has an output which is the output for the DDR flip-flop circuit. Advantageously, this DDR flip-flop circuit uses less power as compared to conventional flip-flop circuits and provides SEU immunity.

In another embodiment, a DDR flip-flop circuit includes a plurality of latch circuits connected in parallel. Each of the latch circuits has a clock input, data input, and latch circuit output. A plurality of C-elements each having a plurality of inputs and a C-element output are connected to the latch circuits via at least one of the plurality of inputs. Each of the inputs of the C-elements may be connected to one of the latch circuit outputs.

The DDR flip-flop circuit further includes an extended C-element having a plurality of inputs and an extended C-element output. At least one of the plurality of inputs of the extended C-element is connected to at least one of the C-element outputs. The extended C-element is similar to a C-element but has additional stacked transistors as compared to the C-element.

The DDR flip-flop circuit also includes an output buffer inverter connected to the extended C-element output. The output buffer inverter has an output that is the flip-flop circuit output. At least one internal keeper circuit is connected to the plurality of C-elements. A C-element keeper circuit is also connected to the C-element output. Advantageously, the present circuit also provides immunity from SEU events.

BRIEF DESCRIPTION OF THE DRAWINGS

The preferred embodiments of the invention will be described in conjunction with the appended drawings provided to illustrate and not to limit the invention, where like designations denote like elements, and in which.

DETAILED DESCRIPTION OF PREFERRED EMBODIMENTS

Flip-flop circuits are widely used in digital circuits to store data. The power, delay, and reliability of the flip-flop circuits directly affect the performance and fault tolerance of the whole integrated circuit formed on a semiconductor chip. Therefore, it is imperative to carefully design flip flop circuits for minimum area, delay, power, and maximum reliability. DDR flip-flop circuits are preferred to enhance the data throughput and to reduce the power consumption of application specific integrated circuit (ASIC) chips. Unlike a regular flip-flop circuit, which stores the input data on only the rising edge of a clock pulse, a DDR flip-flop circuit stores the input data on both rising and falling edges of the clock pulse, which leads to a higher data throughput for the same clock frequency.

A new and robust DDR flip-flop circuit with low power consumption is provided. The DDR flip-flop circuit has a very low activity factor due to its hard edge property and low clock load due to its simple architecture. This combined effect causes the DDR flip-flop circuit's power dissipation and delay to be lower than conventional dual edge flip-flop circuits.

More particularly, the present invention proves a low power DDR flip-flop circuit that uses a C-element to provide immunity to SEUs. Unlike the existing DDR flip-flop circuits, the invention advantageously uses direct clock pulses to latch the data without any additional pulse generator circuitry for the clock signal. Accordingly, the invention lowers the clock dynamic power consumption by a factor of two. Moreover, because of the simplicity of the circuit design which has a very low number of transistors, the invention provides a more robust solution for DDR flip-flop circuits.

Figure 5A:
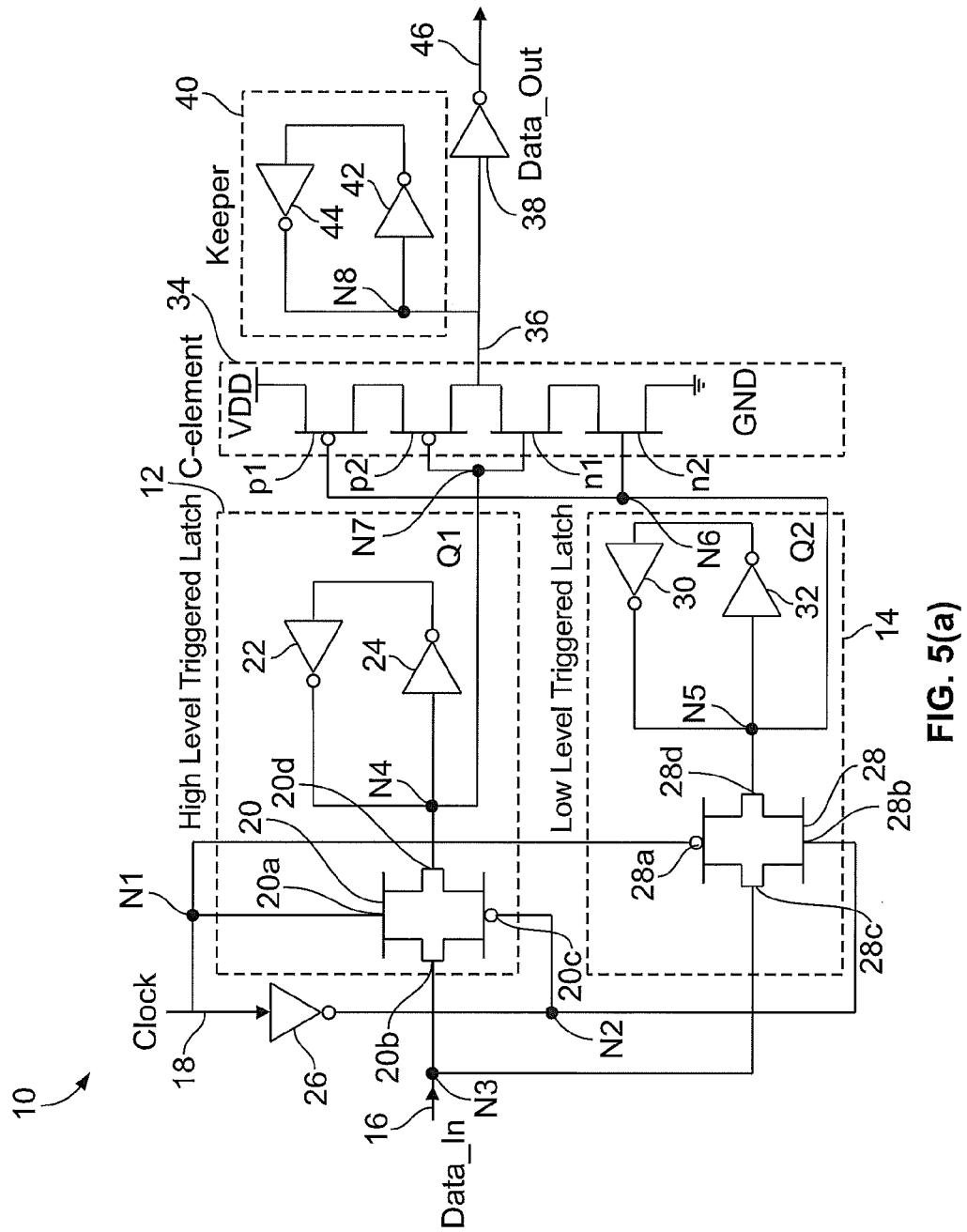
FIG. 5(a) illustrates a schematic of a DDR flip-flop circuit including a C-element according to one embodiment of the invention.

FIG. 5(a) is a schematic of a DDR flip-flop circuit 10 in accordance with the present invention that employs a SEU immune logic architecture. In one embodiment, the DDR flip-flop circuit 10 includes a high level triggered latch circuit 12 and a low level triggered latch circuit 14, which are both outlined in dashed lines. The high level triggered latch circuit 12 and low level triggered latch circuit 14 are arranged in parallel to each other and receive data input from a "Data_in" data line 16. While the high level triggered latch circuit 12 is stacked on the low level triggered latch circuit 14, the circuits may be reversed. The data provided by the data line 16 is provided to the latch circuits 12, 14 by clock pulses of a clock signal generated by a clock generator 18. The leading and trailing ends of the clock pulse trigger the latch circuits 12, 14 as each clock pulse is generated by the clock generator 18. The transition of the clock signal to a high value triggers the high level triggered latch 12. Similarly, the transition of the clock signal to a low value triggers the low level triggered latch circuit 14. Data provided to the data line 16 may then be transferred during the triggering to the latch circuits 12, 14.

The high level triggered latch circuit 12 further comprises a data access gate 20 connected to cross-coupled inverters 22, 24. The data access gate 20 includes an nMOS transistor connected to a pMOS transistor. A node N1 transfers the clock pulse, which is input to a first input or clock input 20a of the latch circuit 12 at the nMOS transistor of the data access gate 20. An inverter 26 provides a delayed and inverted clock pulse, which is input to a node N2 that connects to a second input or clock input 20b of the latch circuit 12 at the pMOS transistor of the data access gate 20. Data is provided via the data line 16 to a node N3 that connects to a third input or data input 20c of the latch circuit 12. A node N4 also connects to an output 20d of the data access gate 20 and provides a latch circuit output Q1.

Similar to the high level triggered latch circuit 12, the low level triggered latch circuit 14 further comprises a data access gate 28 connected to cross-coupled inverters 30, 32. The data access gate 28 includes an nMOS transistor connected to a pMOS transistor. The node N1 transfers the clock pulse, which is input to a first input or clock input 28a of the latch circuit 14 at the nMOS transistor of the data access gate 28. The inverter 26 provides a delayed and inverted clock pulse, which is input to the node N2 that connects to a second input or clock input 28b of the latch circuit 14 at the pMOS transistor of the data access gate 28. Data is provided via the data line 16 to the node N3 that connects to a third input or data input 28c of the latch circuit 14. A node N5 connects to an output 28d of the data access gate 28 and provides a latch circuit output Q2.

In normal operation, data is controlled by the inverter 26 which receives its input from the clock generator 18. Data is provided to data inputs 20b and 28c. When the clock pulse goes low, the inverter 26 inverts the clock pulse to cause the data access gate 28 to transmit the data into the latch circuit 14. When the clock pulse goes high, it causes the data access gate 20 to transmit the data into the latch circuit 12.

The latch circuit outputs Q1 and Q2 are provided via nodes N6 and N7, respectively, to transistor gates of a C-element 34. The C-element 34 includes a plurality of stacked transistors p1, p2, n1, and n2 which are pMOS and nMOS transistors. The gates of the pMOS and nMOS transistors correspond to inputs of the C-element 34. The p1 pMOS transistor of the C-element 34 is connected to a high voltage VDD and the n2 nMOS transistor is connected to a lower ground voltage GND. The latch circuit output Q1 is provided to gates of the p2 and n1 transistors of the C-element 34. The latch circuit output Q2 is provided to gates of the p1 and n2 transistors of the C-element 34.

A C-element output 36 is connected to an output buffer inverter 38 and a node N8 of a keeper circuit 40. The keeper circuit 40 includes a pair of cross-coupled inverters 42, 44 connected in series to the Node N8. The output buffer inverter 38 provides a "Data_Out" output which corresponds to the flip-flop circuit output 46 of the DDR flip-flop circuit 10.

The keeper circuit 40 is a weak keeper circuit that has a twofold functionality. First, the keeper circuit 40 maintains the output state of the C-element 34, even if there is an excessive leakage current passing through the C-element during the period when both the pull-up and pull-down paths of the C-element are shut off. Second, the keeper circuit 40 manages any charge sharing issues that might occur in case the next stage of electronic circuitry connected to the DDR flip-flop circuit 10 is not isolated by static logic.

The output buffer inverter 38 is used to prevent a charge sharing issue at the output node of the C-element 34. Moreover, the DDR flip-flop circuit 10 may have an exposed input diffusion of the transmission gate at the input, which can be overcome by use of an inverter at the data input.

In comparison with the conventional ep-DSFF circuit using a 45 nm complementary metal oxide semiconductor (CMOS) process, the DDR flip-flop circuit 10 consumes less power, with less C2Q propagation delay. The power-delay product of the DDR-flip-flop circuit 10 is better than the conventional ep-DSFF circuit. The DDR-flip-flop circuit 10 further uses only 24 transistors and can easily be implemented into the cell libraries for high performance and low power ASIC design flow. Moreover, by utilizing the C-element 34, the DDR flip-flop circuit 10 captures the input data on both transitions of each clock pulse of the clock signal without any need for a clock pulse generator.

Data input is transmitted in parallel to both the high level and low level triggered latch circuits 12, 14. Thus, allowing the present DDR flip-flop circuit 10 to capture any transitions in the input data during the entire clock pulse period. Since the C-element 34 stores the data until both of the latch circuit outputs Q1 and Q2 become equal, the C-element includes both the storage and edge triggering attributes of a flip-flop circuit, eliminating the need for any clock pulse generator as used in conventional dual edge triggered flip-flop circuits.

Although the ep-DSFF circuit seems to be very simple and efficient due to its explicit pulse generator, it increases the clock activity factor and dynamic clock power consumption. Moreover, the two transmission gates used in the pulse generator have a current contention problem during clock pulse transition. Furthermore, the exposed input diffusion of the transmission gate at the input makes the ep-DSFF circuit susceptible to noise. The DDR flip-flop circuit 10 advantageously overcomes these problems.

The DDR flip-flop circuit 10 splits the sequential two latch circuit structure used in a conventional D flip-flop and organizes the latch circuits in parallel as shown in FIG. 5(a). The outputs Q1 and Q2 of the two latch circuits 12, 14 are then provided to the two inputs at nodes N6 and N7 of the C-element 34. By virtue of its operation, the C-element 34 holds the present data until both of the inputs provided to the C-element become equal in value. Once both inputs provided to the C-element 34 become equal, then the C-element acts as a simple inverter. The waveforms of the data input, clock signal, and output signal for the DDR flip-flop circuit 10 are shown in FIG. 5(b).

Figure 5B:
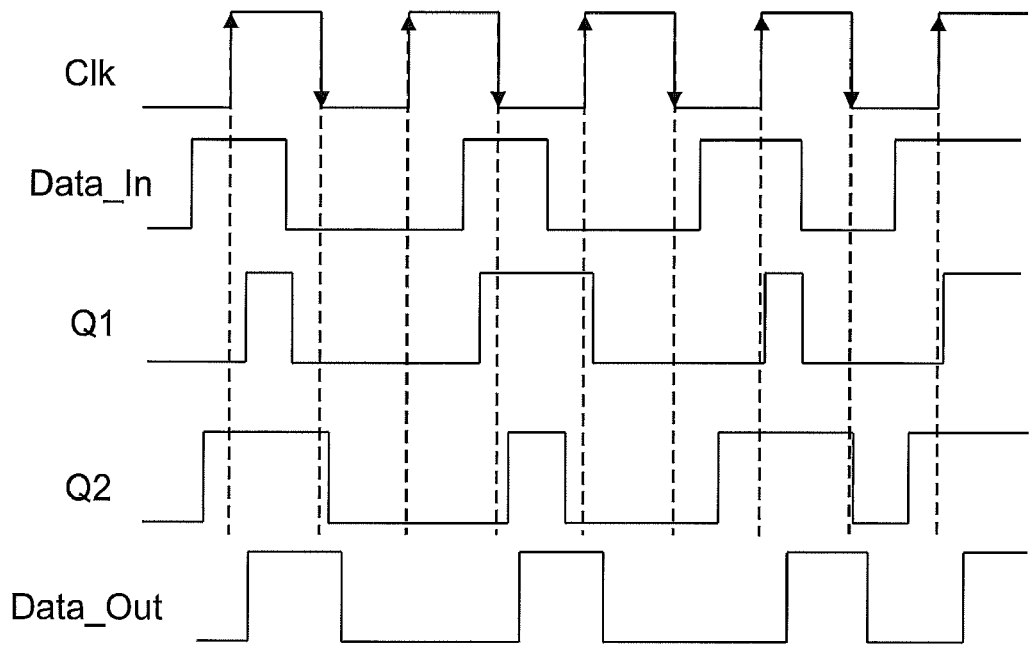
FIG. 5(b) illustrates waveforms for the D flip-flop circuit of FIG. 5(a)

The waveforms shown in FIG. 5(b) illustrate the dual-edge functionality of the DDR flip-flop circuit 10 of FIG. 5(a), which uses only a few transistors more than a conventional D flip-flop circuit. Moreover, the DDR flip-flop circuit 10 has the same capacitive load on the clock network as a conventional D flip-flop circuit.

Advantageously, because of absence of the clock pulse generator circuitry in the DDR flip-flop circuit 10, the DDR flip-flop circuit has a lower clock load than a conventional ep-DSFF circuit. Even if the pulse generator circuit is shared between many ep-DSFF flip-flops (e.g. in a multiple bit DDR data path), the DDR flip-flop circuit 10 still consumes lower dynamic power at the clock input than the ep-DSFF circuit. This lower power consumption is mainly due to the activity factor being doubled in the pulsed clock as compared to a normal clock. The DDR flip-flop circuit 10 also has better SEU immunity than the ep-DSFF circuit. This is because the C-element 34 is used to store the data only during any mismatch between its inputs.

Figure 6A:
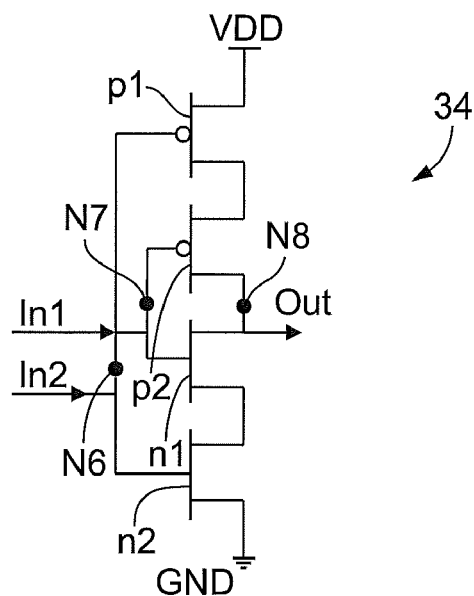
FIG. 6(a) illustrates a schematic of a C-element according to one embodiment of the invention.
Figures 6B, 6C, 6D:
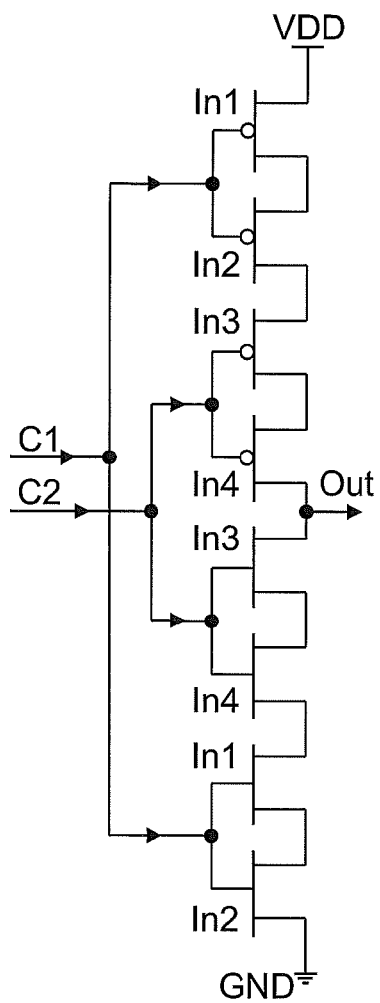
FIG. 6(b) illustrates a truth table for the C-element of FIG. 6(a)
FIG. 6(c) illustrates a schematic of an extended C-element according to one embodiment of the invention.
FIG. 6(d) illustrates a truth table for the extended C-element of FIG. 6(c)

FIG. 6(a) shows a schematic of the C-element 34. The input line "In 1" transmits the Q1 output to the C-element 34 and the input line "In 2" transmits the Q2 output to the C-element. FIG. 6(b) shows the truth table for the C-element.

As indicated in the truth table, when the C-element receives a low logic value (0) Q1 output and a (0) Q2 output, then a high logic value (1) is output from the C-element. Conversely, a (1) Q1 output and (1) Q2 output generates a (0) C-element output. For Q1=(0) and Q2=(1) or vice-versa, the C-element outputs its previous value.

Simulations of the DDR flip-flop circuit 10 were performed using the Berkeley Predictive Transistor Model (BPTM) in a 45 nm metal gate high K dielectric CMOS technology, with a supply voltage of 0.9V. The designs were optimized for a clock frequency of 1 GHz and data switching activity equal to 0.5. A load capacitance of 10 fF was used for the output. Transistor sizing was optimized using an iterative procedure with the objective of achieving high speed and low power.

Table 1 summarizes the numerical results for the conventional ep-DSFF circuit along with the DDR flip-flop circuit 10 (C-DDR FF). The DDR flip-flop circuit 10 consumes 32% less power, with 12% less C2Q delay than the ep_DSFF circuit. The clock load of DDR flip-flop circuit 10 is 62% lower than that of ep-DSFF circuit. Also, the power-delay product of the DDR-flip-flop circuit 10 is 41% better than the ep-DSFF circuit.

TABLE 1

|  | Delay [ps] | Power [µW] | PDP [fJ] | CLK Load [fF] | Device Count |
| --- | --- | --- | --- | --- | --- |
| ep-DSFF | 76.23 | 5.68 | 0.433 | 8.88 | 20 |
| C-DDR FF | 66.58 | 3.86 | 0.257 | 3.35 | 24 |

Turning now to FIG. 6(c), a schematic of an extended C-element 50 is illustrated. The extended C-element 50 includes a series of four pMOS transistors p1-p4 stacked on four nMOS transistors n1-n4 to form an eight transistor stack. The p1 transistor connects to a power supply VDD and the n4 transistor connects to a lower ground voltage GND. The extended C-element receives a C1 input that is provided at nodes N1, N2 and via lines "In 1 and In 2" to gates of the p1, p2, n3, and n4 transistors. A C2 input is provided at nodes N3, N4 and via lines "In 3 and In 4" to gates of the p3, p4, n1, and n2 transistors. A node N5 transfers the output from the extended C-element 50.

FIG. 6(d) shows a truth table for the extended C-element of FIG. 6(c). As indicated in the truth table, when the extended C-element 50 receives a low logic value (0) corresponding to a C1=(0) input and a (0) C2 input, then a high logic value (1) is output from the extended C-element. Conversely, a C1=(1) input and C2=(1) input generates a (0) extended C-element output. For C1=(0) and C2=(1) or vice-versa, the extended C-element outputs its previous value.

Figure 7:
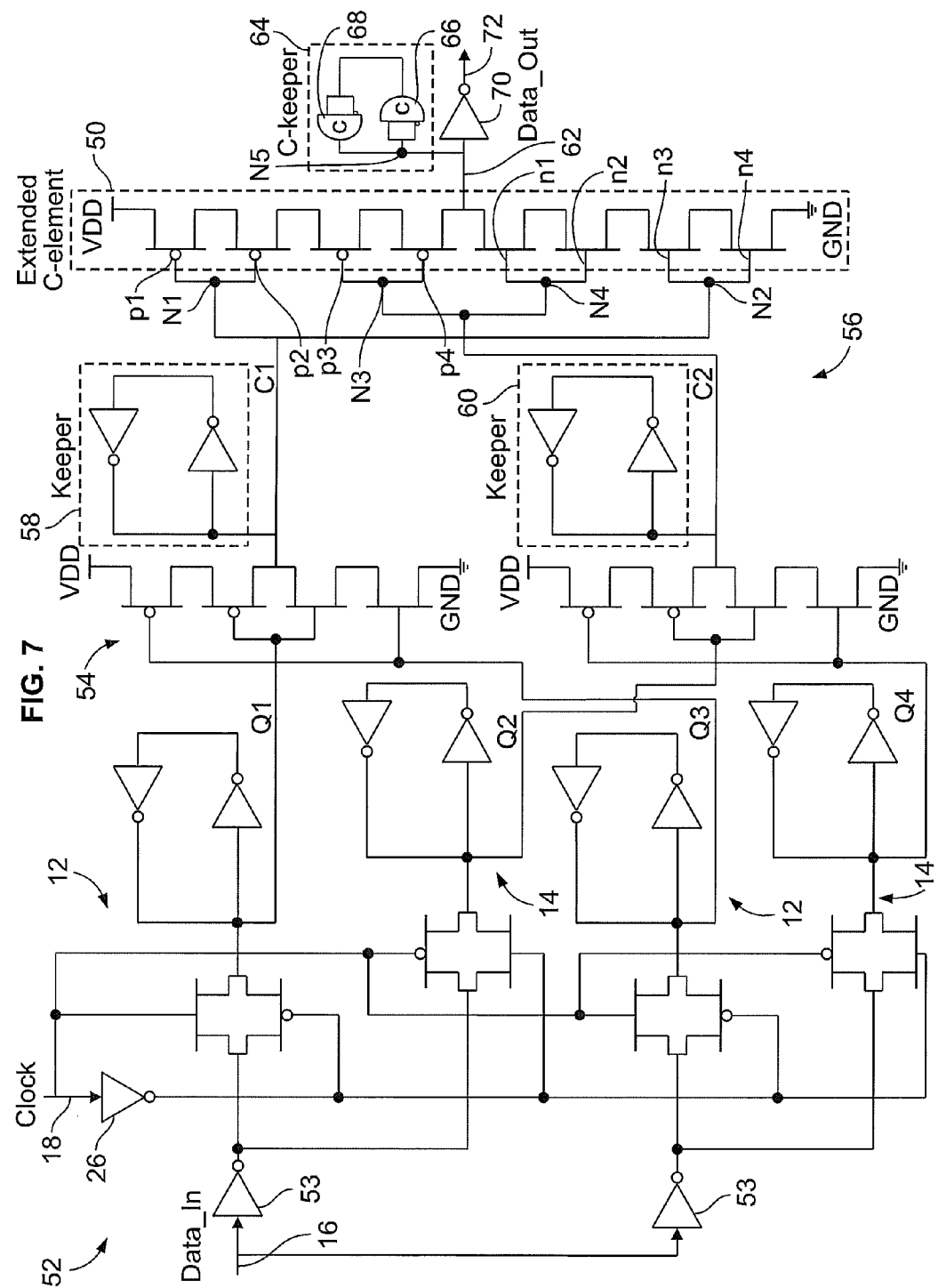
FIG. 7 illustrates a schematic of a DDR flip-flop circuit having an extended C-element according to one embodiment of the invention.

FIG. 7 is a schematic of another embodiment of a DDR flip-flop circuit 52 which includes the extended C-element 50. The circuit 52 has four latch circuits in parallel similar to the DDR flip-flop circuit 10 that has two latch circuits in parallel. The clock generator 18 provides a clock pulse or signal to the four latch circuits that transfer data from the data line 16. Prior to entering the four latch circuits, the data is inverted by inverters 53. There are two high level triggered latch circuits and two low level triggered latch circuits in parallel that generate four latch circuit outputs Q1-Q4. Although the latch circuits are stacked in a high-low-high-low arrangement, a low-high-low-high arrangement may also be implemented. The two outputs from the high-level triggered latch circuits are given to one C-element 54 and the two outputs from the low-level triggered latch circuits are given to another C-element 56. This helps the nodes Q1 and Q3 to stabilize into node C1 which remains unaffected by any SEU transmitting on nodes Q1 or Q3 even during clock pulse transitions. Similarly nodes Q2 and Q4 stabilize into node C2. The high level triggered latch circuit outputs Q1 and Q3 are provided to the first C-element 54. The low level triggered latch circuit outputs Q2 and Q4 are provided to the second C-element 56. The first C-element has an internal keeper circuit 58 connected to a first C-element output C1, and the second C-element has an internal keeper circuit 60 connected to a second C-element output C2.

The stabilized C1 and C2 outputs are provided as inputs to the extended C-element 50 similar to the C1 and C2 inputs shown in FIG. 6(c). An extended C-element output 62 is provided to the node N5 of a C-element keeper circuit 64. The C-element keeper circuit 64 includes a pair of cross-coupled C-elements 66, 68 formed in series and connected to the node N5. The extended C-element output 62 is provided to an output buffer inverter 70 which inverts the C-element output to generate a flip-flop circuit output 72 ("Data_Out").

The extended C-element 50 is immune to SEUs even during the float mode when both inputs C1 and C2 are not same as there are always two transistors ON/OFF, unlike a normal C-element where only one transistor is ON/OFF in the pull-up or pull-down path. This can be seen from FIG. 6(c) which shows that each input C1 and C2 are split into two inputs In1, In2 and In3, In4 respectively. Thus, even if there is a radiation strike or SEU on any one of the two transistors at "In1 and In2" or "In3 and In4", the other transistor is still unaffected which preserves the output value. Unlike at the final stage (nodes C1 and C2), there is no need to use an extended C-element or C-keeper circuit for the internal nodes, since the internal nodes are used to compare similar inputs (nodes Q1 and Q3 or nodes Q2 and Q4). Due to this architecture, the DDR flip-flop circuit 52 has the advantage of latching the data on both edges of the clock as well as full immunity to SEUs, even if it occurs at the time of clock pulse transitions. Although the internal nodes of the DDR flip-flop circuit 52 are sensitive to SEUs, the internal nodes cannot propagate an erroneous value to the flip-flop circuit output 72 thereby making the DDR flip-flop circuit 52 immune to SEUs.

The extended C-element 50 is made to float in order to store data similar to the DDR flip-flop circuit 10. Therefore, if the extended C-element keeper circuit 64 is made out of inverters and a particle strike happens on the extended C-element keeper circuit during the period when the extended C-element 50 is afloat, then it will drive the flip-flop circuit output 72 to a faulty value even though the extended C-element keeper circuit is a weak driver. In order to avoid such situations the keeper circuit 64 at the flip-flop circuit output 72 of the DDR flip-flop circuit 52 is formed of the back to back C-elements 66, 68 instead of inverters. As the C-elements by virtue of their functionality are immune to SEUs, the extended C-element keeper circuit 64 will not provide a faulty value at the flip-flop circuit output 72 even though the internal nodes of the DDR flip-flop circuit 52 are sensitive to SEUs. Thus, the present DDR flip-flop circuit 52 can provide SEU immunity without using a lot of area in integrated circuit designs.

Figure 8:
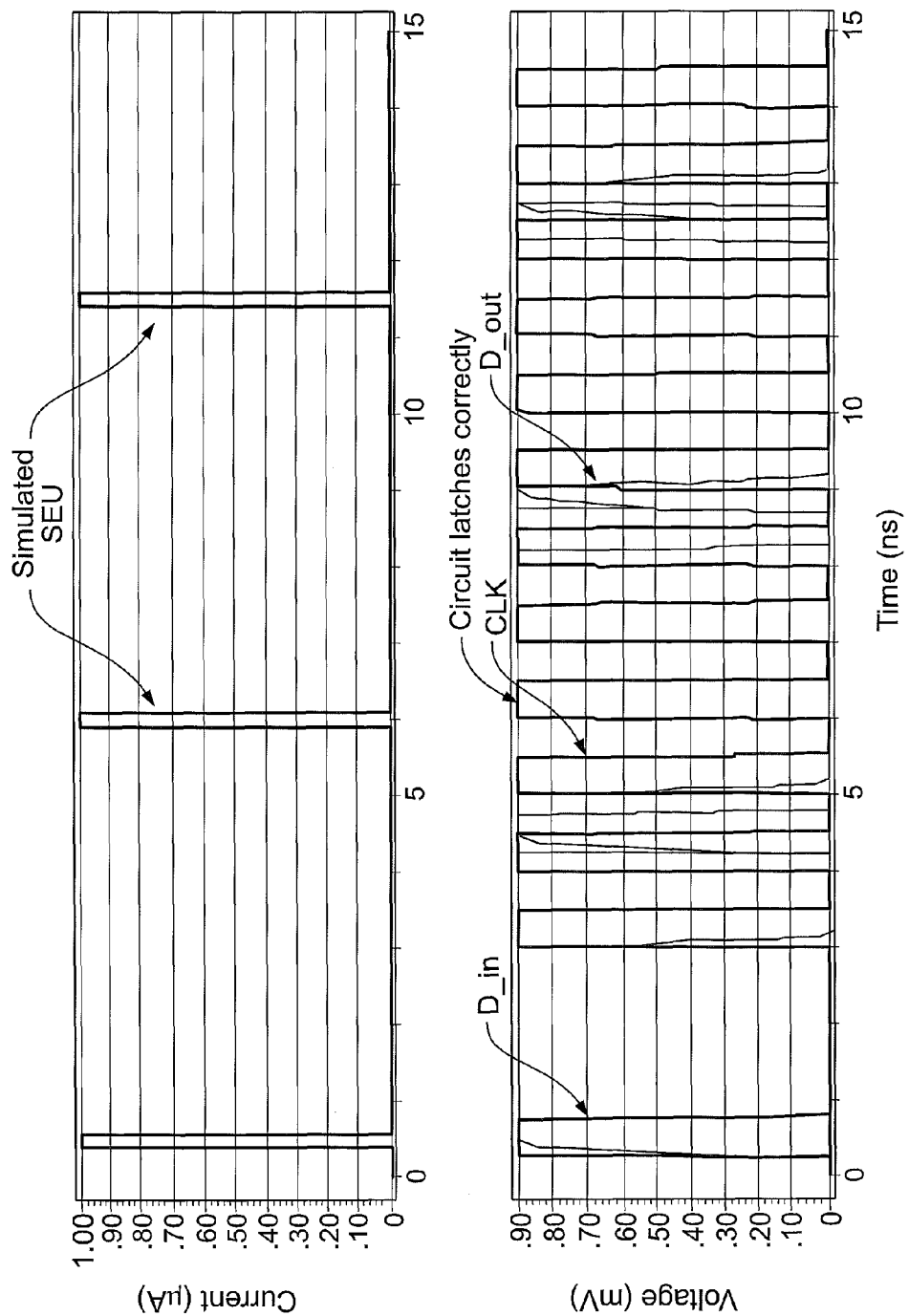
FIG. 8 illustrates a simulated waveform diagram showing an output for the DDR flip-flop circuit of FIG. 7.

FIG. 8 is a simulated waveform diagram showing an output for the DDR flip-flop circuit 52 of FIG. 7. The simulations on the flip-flop circuits are performed using the Predictive Transistor Model (PTM) in a 45 nm metal gate, high K dielectric CMOS technology, with a supply voltage of 0.9 V. The designs were optimized for a clock frequency of 1 GHz and data switching activity equal to 0.5. A load capacitance of 10 fF was used for the output. The SEUs are simulated using a current source of 500 μA peak current and 200 ps width. The SEUs immunity testing is performed by providing the current source at different time intervals on drains of various transistors in the DDR flip-flop circuit 52. Transistor sizing was optimized using an iterative procedure with the objective of achieving low power-delay-product.

Figure 1A:
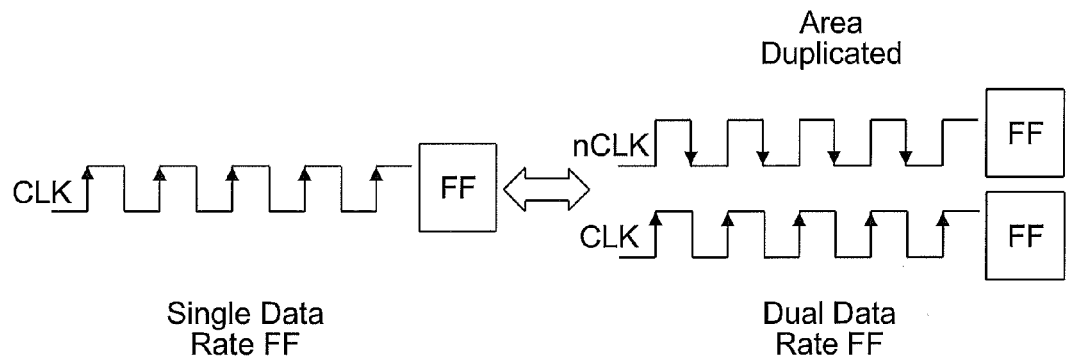
FIG. 1(a) illustrates a conventional dual edge triggered flip-flop scheme.
Figure 1B:
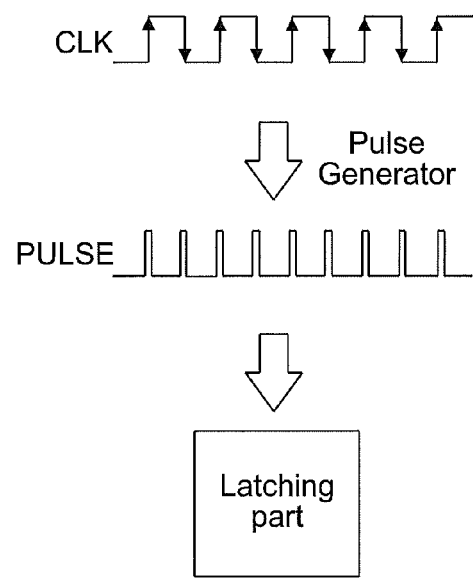
FIG. 1(b) illustrates a conventional explicit pulsed dual edge triggered flip-flop scheme.
Figure 1C:
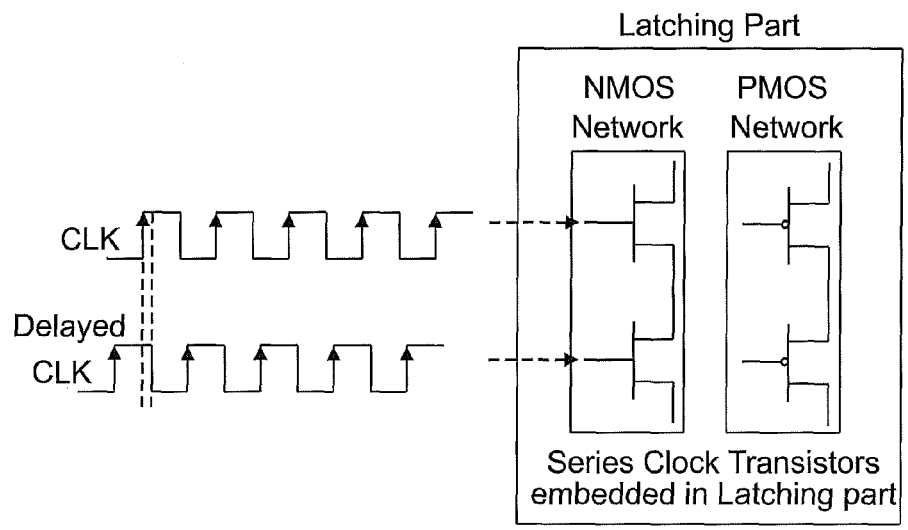
FIG. 1(c) illustrates a conventional implicit dual edge triggered flip-flop scheme.
Figure 1D:
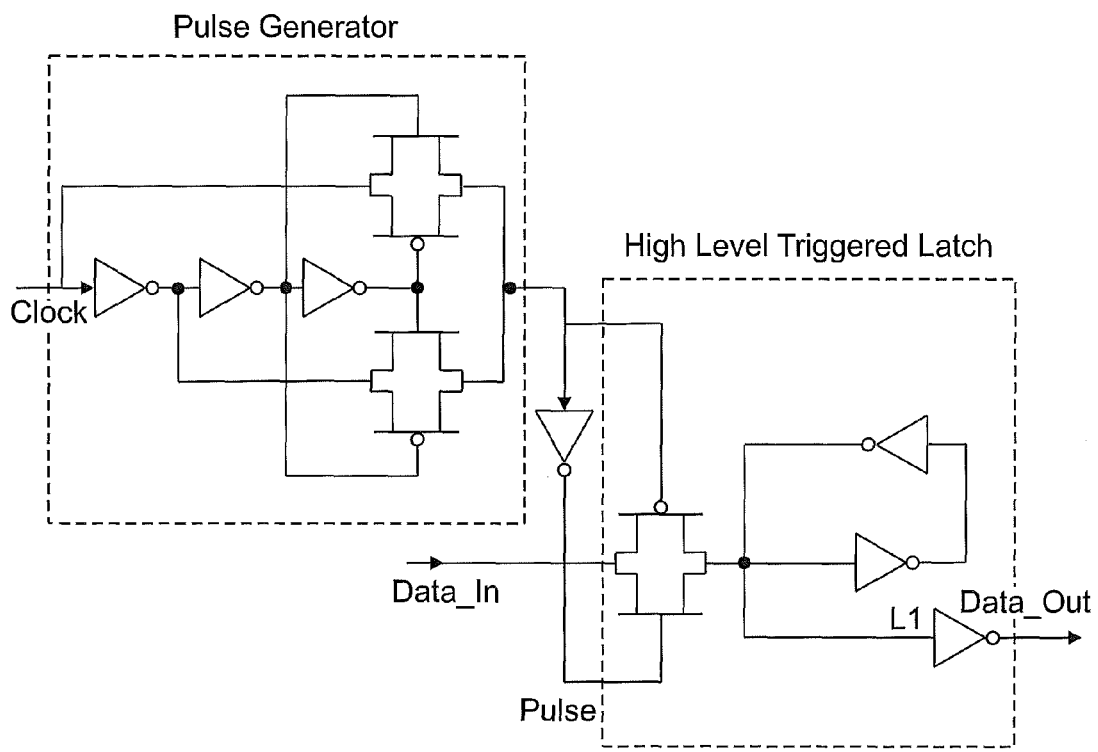
FIG. 1(d) illustrates a schematic of a conventional dual edge static hybrid flip-flop circuit (ep-DSFF)
Figure 1E:
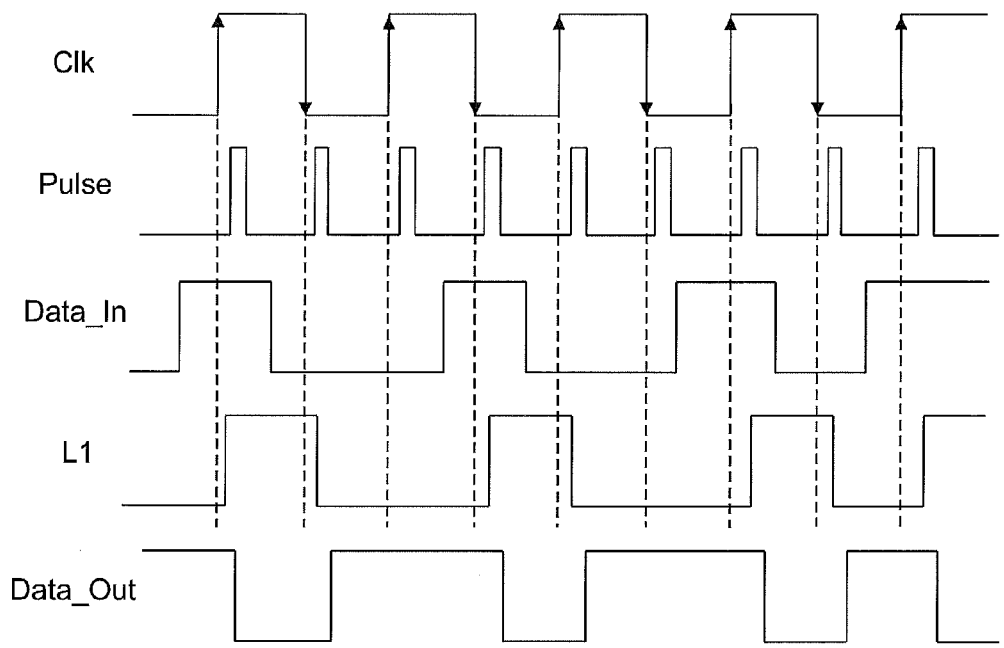
FIG. 1(e) illustrates waveforms for the ep-DSFF circuit of FIG. 1(d)
Figure 2:
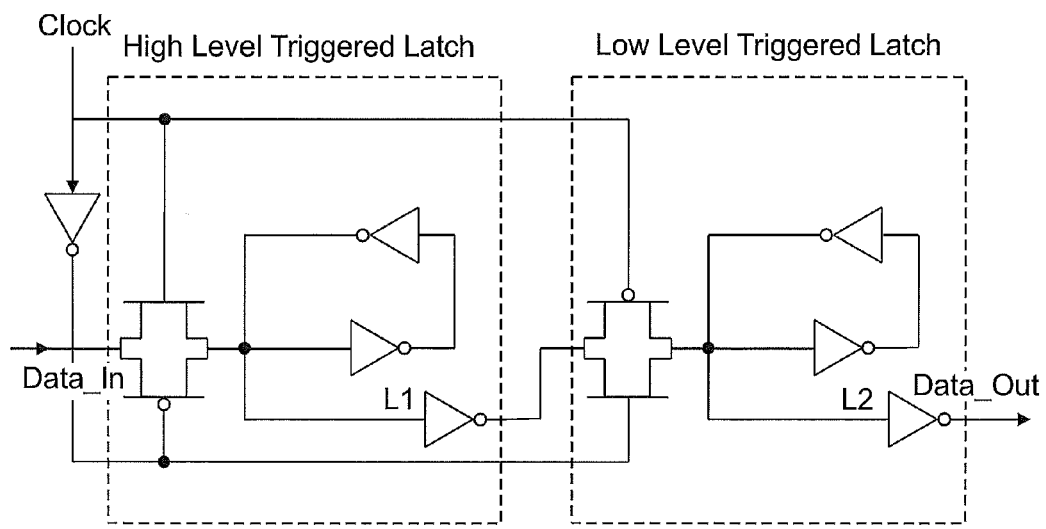
FIG. 2 illustrates a conventional D flip-flop circuit.
Figure 3:
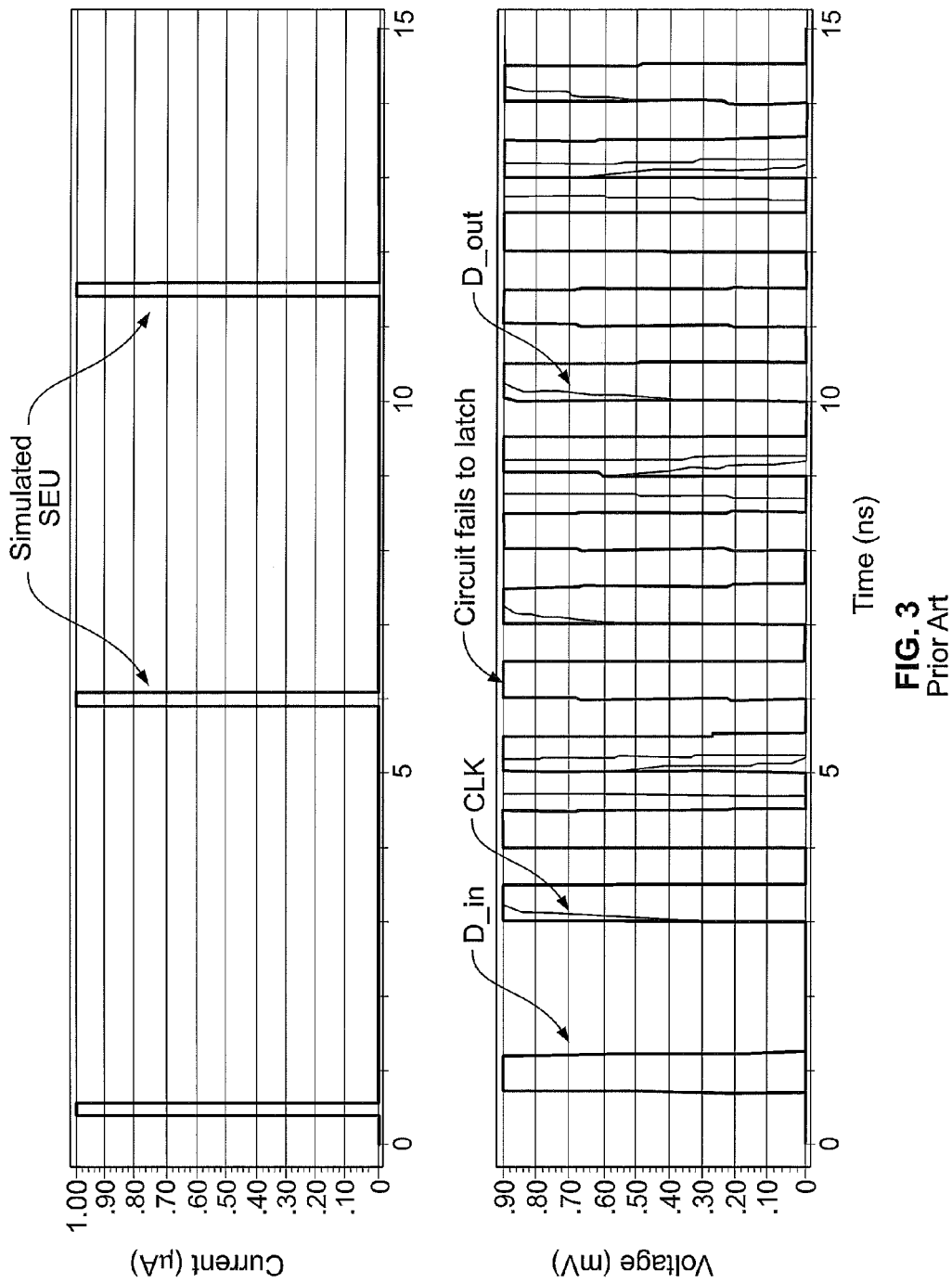
FIG. 3 illustrates a simulated waveform diagram showing a conventional simplified B-SER-FF output.
Figure 4:
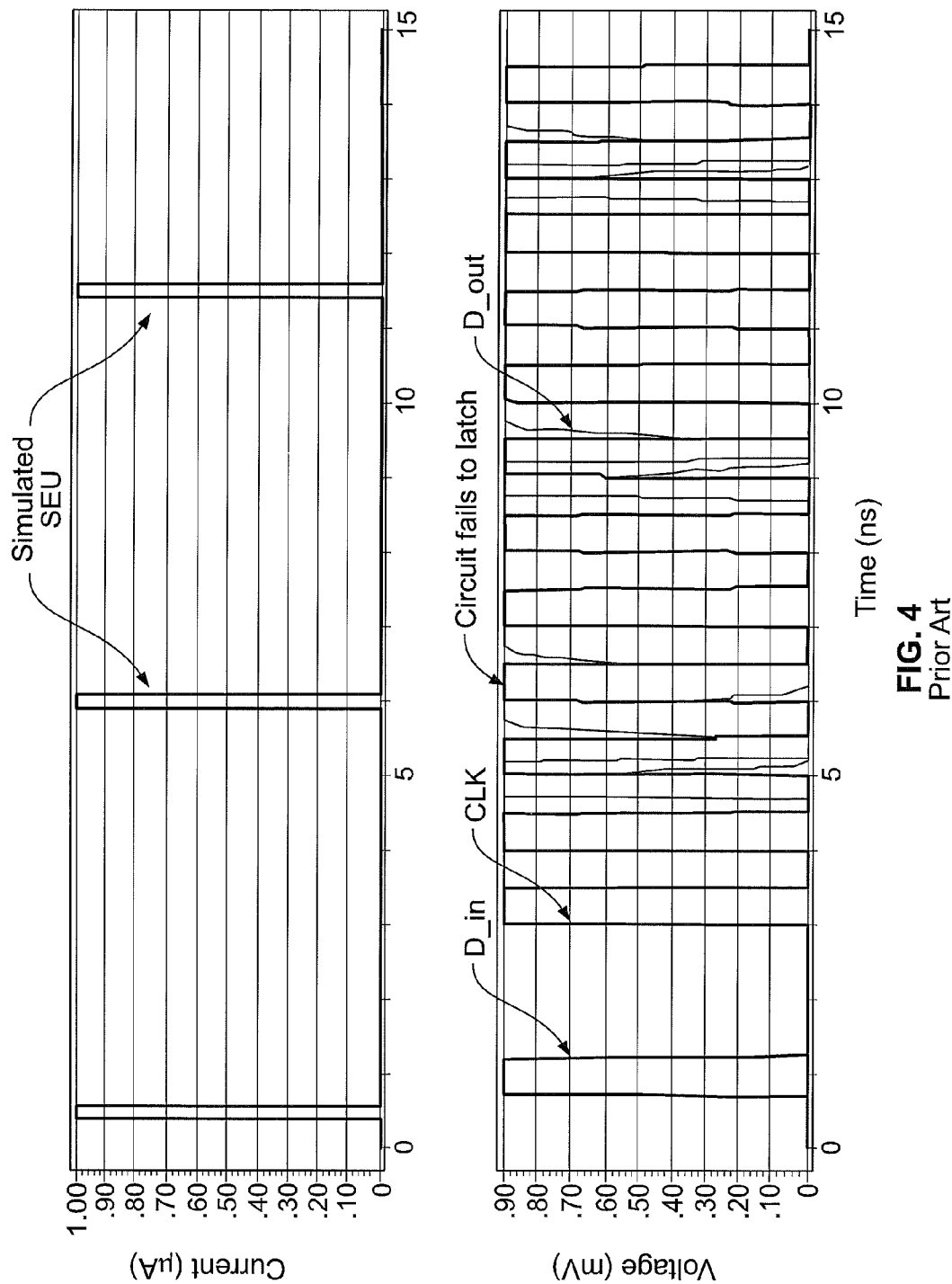
FIG. 4 illustrates a simulated waveform diagram showing a conventional simplified B-SER-FF output using a conventional dual edge triggered technique.

Table 2 shown below summarizes the numerical results for the conventional simplified B-SER-FF circuit, conventional simplified B-SER-FF circuit with DDR using a conventional dual edge triggered technique, and a DDR flip-flop circuit 52 referred to in Table 2 as "Firebird". The DDR flip-flop circuit 52 consumes 19.6% less power, with 9.5% more C2Q delay than its counterpart B-SER-FF circuit with DDR. Also, the power-delay product of the DDR flip-flop circuit 52 is 11.2% better than the B-SER-FF circuit with DDR. Moreover, the DDR flip-flop circuit 52 has a more comprehensive SEU immunity as shown in FIG. 8 unlike the conventional circuit results shown in FIGS. 3 and 4 where the output signal is not always latched correctly.

TABLE 2

| | Delay (ps) | Power (μW) | PDP (fJ) | SEU sensitive nodes[a] | SEU Immunity |
|---|---|---|---|---|---|
| Simplified B-SER-FF | 67.2 | 6.78 | 0.456 | 2 | Incomplete |
| Simplified B-SER-FF with DDR | 81.4 | 9.64 | 0.785 | 4 | Incomplete |
| Firebird | 89.9 | 7.75 | 0.697 | 0 | Complete |

The DDR flip-flop circuits 10 and 52 provide SEU-hardened dual data rate flip-flop circuits that require less semiconductor chip space. Unlike the existing conventional radiation hardened flip-flop circuits, the present DDR flip-flop circuits 10 and 52 advantageously latch data on both clock edges. The DDR flip-flop circuits also prevent latching of faulty data due to SEUs occurring at nodes within the DDR flip-flop circuits which could propagate to the outputs of the circuits.

While the foregoing written description of the invention enables one of ordinary skill to make and use what is considered presently to be the best mode thereof, those of ordinary skill will understand and appreciate the existence of variations, combinations, and equivalents of the specific embodiments, and examples herein. The invention should therefore not be limited by the above described embodiments and examples, but by all embodiments within the scope and spirit of the invention.

What is claimed is:

1. A dual data rate flip-flop circuit comprising:
  a plurality of latch circuits connected in parallel, each latch circuit including a clock input, a data input, and a latch circuit output;
  a plurality of C-elements, each C-element including a plurality of C-element inputs and a C-element output, at least one of said plurality of C-element inputs being connected to said latch circuit output of at least one said latch circuit;
  an extended C-element having a plurality of extended C-element inputs and an extended C-element output, at least one of said plurality of extended C-element inputs being connected to at least one of said C-element output;
  an output buffer inverter connected to said extended C-element output, said output buffer inverter having a flip-flop circuit output;
  at least one internal keeper circuit connected to said plurality of C-elements; and a C-element keeper circuit connected to said extended C-element output.

2. The dual data rate flip-flop circuit of claim 1, wherein said plurality of latch circuit comprises four latch circuits.

3. The dual data rate flip-flop circuit of claim 2, wherein said four latch circuits includes two high level triggered latch circuits and two low level triggered latch circuits.

4. The dual data rate flip-flop circuit of claim 3, wherein said plurality of C-elements comprises a first C-element connected to said two high level triggered latch circuits and a second C-element connected to said two low level triggered latch circuits.

5. The dual data rate flip-flop circuit of claim 1, wherein said plurality of C-elements comprises a first C-element and a second C-element connected to an extended C-element having an eight transistor stack.

6. The dual data rate flip-flop circuit of claim 5, wherein said output from said first C-element is connected to two p-MOS transistors and two n-MOS transistors of said eight transistor stack, and said output from said second C-element is connected to another two p-MOS transistors and another two n-MOS transistors of said eight transistor stack.

7. The dual data rate flip-flop circuit of claim 1, wherein said at least one internal keeper circuit comprises two internal keeper circuits each connected to a separate output of said plurality of C-elements.

8. The dual data rate flip-flop circuit of claim 7, wherein each internal keeper circuit comprises a pair of inverters.

9. The dual data rate flip-flop of claim 8, wherein said pair of inverters are connected in series.

10. The dual data rate flip-flop of claim 1, wherein said C-element keeper circuit includes a plurality of C-elements in series.

11. The dual data rate flip-flop of claim 10, wherein said plurality of C-elements comprises two cross-linked C-elements.

* * * * *